(12) United States Patent
Lee

(10) Patent No.: US 7,960,778 B2
(45) Date of Patent: Jun. 14, 2011

(54) FLASH MEMORY CELL STRING

(75) Inventor: Jong-Ho Lee, Daegu (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 12/314,163

(22) Filed: Dec. 5, 2008

(65) Prior Publication Data
US 2009/0184362 A1    Jul. 23, 2009

(30) Foreign Application Priority Data
Dec. 7, 2007  (KR) ..................  10-2007-0126674

(51) Int. Cl.
  *H01L 29/788*  (2006.01)
(52) U.S. Cl. ............................. 257/316; 257/E29.309
(58) Field of Classification Search .................. 257/316, 257/E29.309
See application file for complete search history.

(56) References Cited

U.S. PATENT DOCUMENTS

| | | | |
|---|---|---|---|
| 2006/0258063 A1* | 11/2006 | Forbes | 438/149 |
| 2008/0073695 A1* | 3/2008 | Mizukami et al. | 257/316 |
| 2008/0111178 A1* | 5/2008 | Kinoshita et al. | 257/316 |

* cited by examiner

*Primary Examiner* — Benjamin P Sandvik
*Assistant Examiner* — W. Wendy Kuo
(74) *Attorney, Agent, or Firm* — The Nath Law Group; Jerald L. Meyer; Robert T. Burns

(57) ABSTRACT

The present invention relates to a flash memory cell string. The flash memory cell string includes a plurality of cell devices and switching devices connected to ends of the cell devices. Each of the cell devices includes a semiconductor substrate, and a transmissive insulating layer, a charge storage node, a control insulating layer and a control electrode sequentially formed on the semiconductor substrate. In the flash memory cell string, a buried insulating layer is provided on the semiconductor substrate between the cell device and an adjacent cell device, thus enabling an inversion layer, which performs the functions of source/drain, to be easily formed. According to the present invention, the reduction characteristics and performance of the cell devices of NAND flash memory are improved, and the inversion layer of a channel is induced through fringing electric fields from the control electrode and the charge storage node if necessary.

10 Claims, 12 Drawing Sheets

FIG. 3
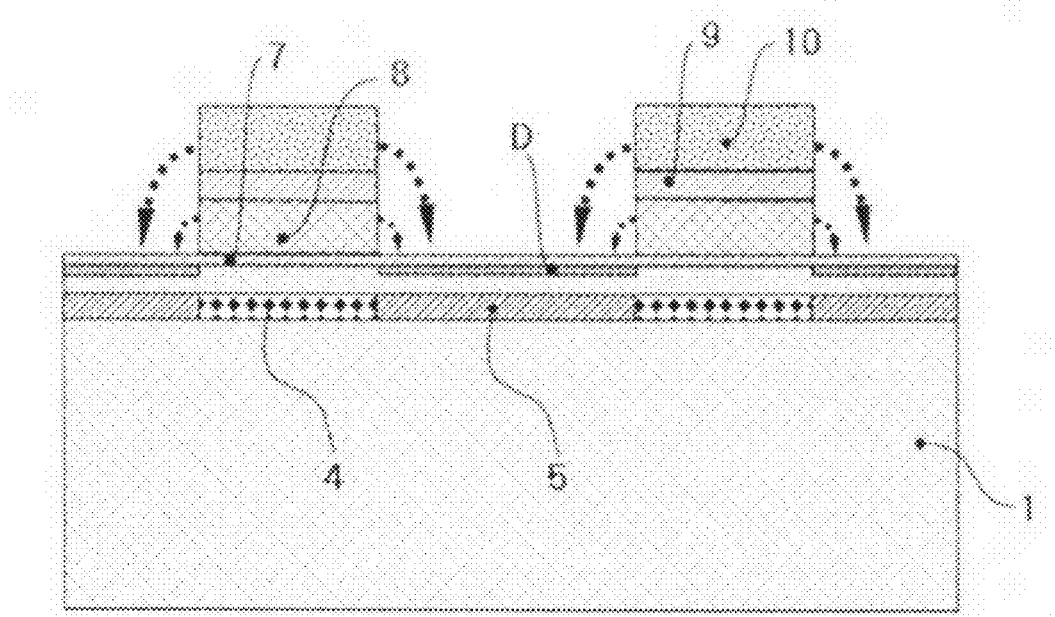
(a)
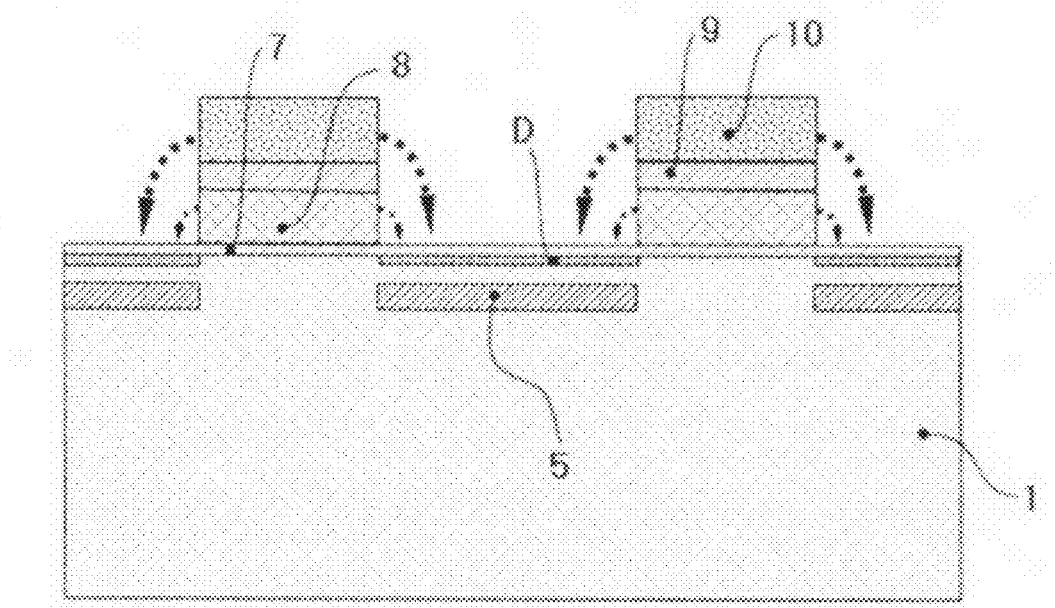
(b)

FIG. 6
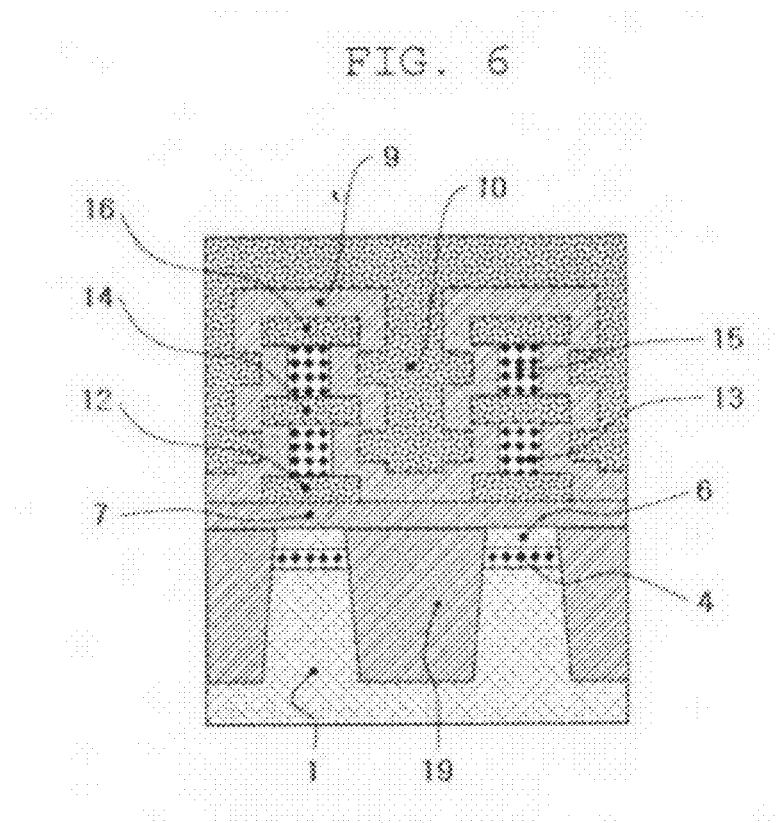
(a)
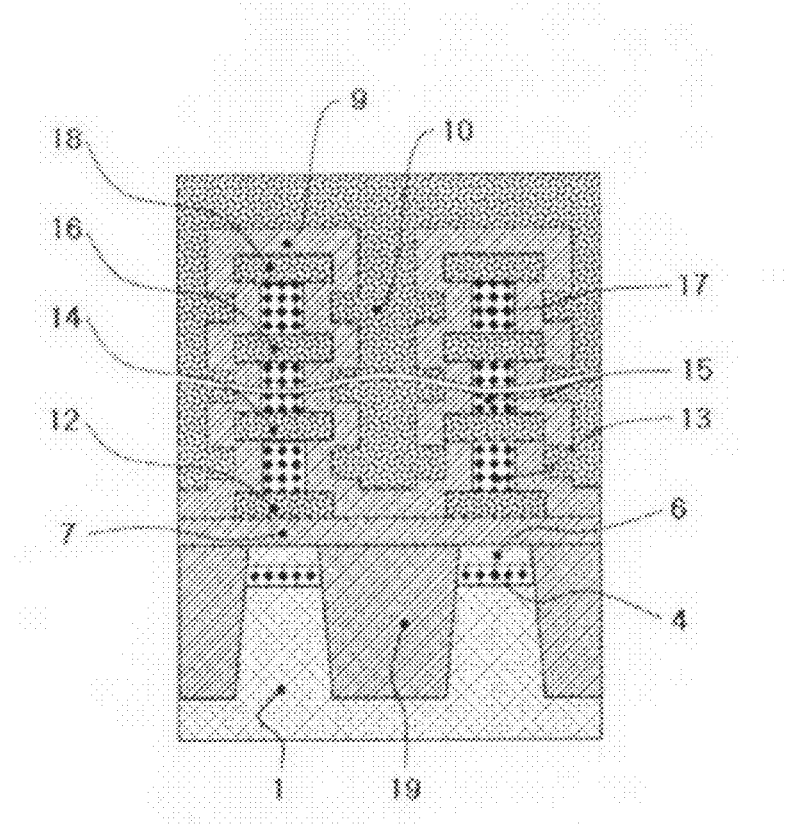
(b)

FIG. 8
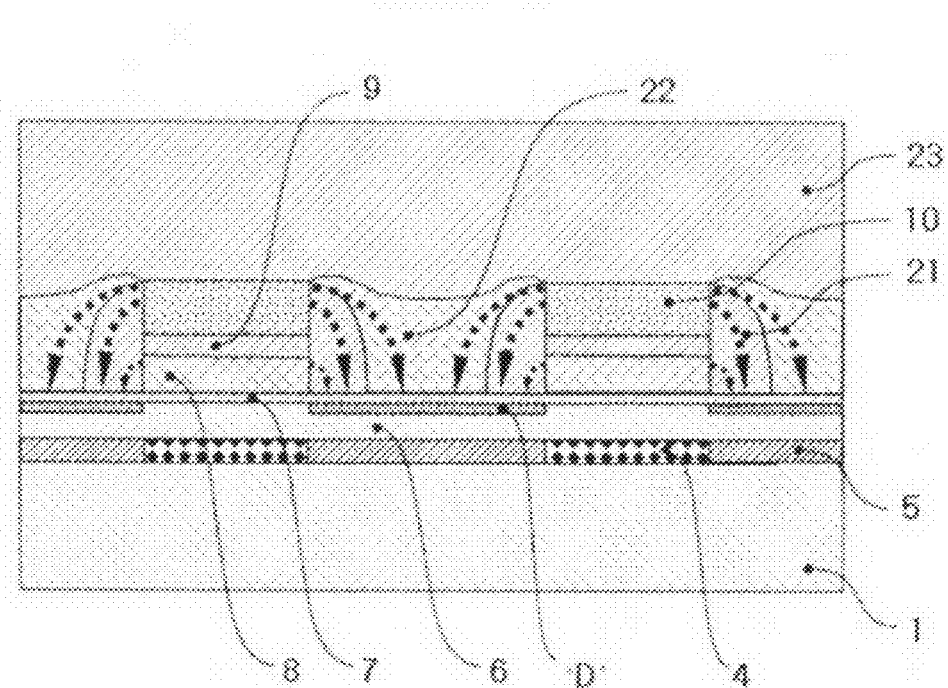
(a)
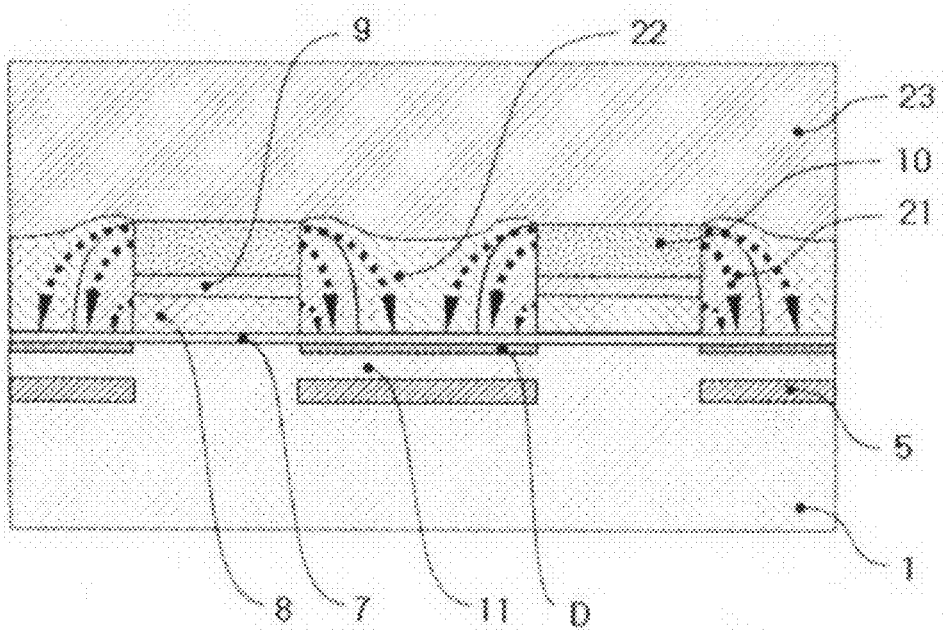
(b)

FLASH MEMORY CELL STRING

CROSS-REFERENCE TO RELATED PATENT APPLICATION

This application claims the benefit of Korean Patent Application No. 10-2007-0126674, filed on Dec. 7, 2007, in the Korean Intellectual Property Office, the disclosure of which is incorporated herein in its entirety by reference.

BACKGROUND OF THE INVENTION

1. Field of the Invention

The present invention relates, in general, to a NAND flash memory cell string, and, more particularly, to a new NAND flash memory cell string, which improves the size reduction characteristics and performance of a MOS-based flash memory device and increase memory capacity.

2. Description of the Related Art

Recently, a demand for flash memory in electric home appliances and portable electronic devices has rapidly increased, and an increase in the capacity of flash memory has been continuously required. In the future, reduction in the size of a cell device to that of 20 nm is predicted.

The degree of integration of NAND flash memory needs to be continuously increased with the development of Information Technology (IT) technology. The degree of integration of NAND flash memory is greatly influenced by the degree of integration of a cell device. Recently, the length of the gate of a cell device has been reduced below 50 nm, and the capacity of memory has reached several tens of Giga bits. Because of this tendency, a Multi-Level Cell (MLC) having a U-shape floating-poly electrode (U-shape floating-poly cell for MLC NAND flash memory devices in the 13th Korean Conference on Semiconductors, p. 103, 2006), which realizes a high coupling effect and low crosstalk using existing floating gates, was published by the Samsung Electronics Co. Ltd. However, with the reduction in the size of cells, in order to form a U-shape floating-poly electrode, the pitch of the poly electrode in the direction of channel width increases to about 100 nm or more, thus causing problems. Further, with the reduction in the size of cells, a U-shape structure and an existing structure exhibit a serious short-channel effect at a gate length of about 45 nm or less. Further, demands for a multi-level cell have increased, but such a serious short-channel effect attributable to the size reduction of cell devices increases the distribution of threshold voltages at the time of implementing a multi-level cell, and thus great difficulty is expected. The degree of integration can be improved only when the length of a gate is continuously reduced in the future. For this requirement, an alternative plan must be considered. In order to improve the degree of integration of a device having an existing floating-poly electrode, various types of research have been conducted and various products have been developed. As examples of the results of such research, there are memory cells, each having a three-dimensional structure such as a Fin field effect transistor (FinFET) and a recessed channel device, and flash memory devices such as Silicon-Oxide-Nitride-Oxide-Silicon (SONOS) memory and Nano-Floating Gate Memory (NFGM) using a nitride film or an insulating storage electrode. Such a device has become one plan for solving the problem of size reduction of flash memory having existing floating-poly electrodes. However, such an improved device also faces a problem in that device characteristics have greatly decreased due to a short-channel effect or in that a reduction in size is impossible in the case of a gate length corresponding to 40 nm or less.

In order to suppress a short-channel effect and reduce the distribution of threshold voltages, occurring when the gate length of a cell device is reduced to 40 nm or less, a SONOS cell device (or TaN—AlO—SiN-Oxide-Si: TANOS) having an asymmetric source/drain structure in a flat channel device (K. T. Park et al, A 64-cell NAND flash memory with asymmetric S/D structure for sub-40 nm technology and beyond, in Technical Digest of Symposium on VLSI Technology, p. 24, 2006) was published by the Samsung Electronics Co. Ltd. This shows a structure in which a source or drain region is present on one side and is not present on the other side around the gate of a cell device. Further, this structure denotes a structure in which an inversion layer is formed in the region having no source or drain using a fringing electric field generated from a control electrode, thus suppressing a short-channel effect. Compared to an existing SONOS cell device having a flat channel with source/drain regions, size reduction characteristics may be improved. However, since either one of the source and drain of the cell device is formed to overlap the control electrode, a short-channel effect is exhibited at a channel length of 40 nm or less, thus facing a limitation in the size reduction of a flat channel structure.

A flash device structure in which a channel is recessed and a conductive floating gate is used as a storage electrode so as to reduce a short-channel effect occurring in the existing flat channel structure (S.-P. Sim et al, Full 3-dimensional NOR flash cell with recessed channel and cylindrical floating gate—A scaling direction for 65 nm and beyond, in Technical Digest of Symposium on VLSI Technology, p. 22, 2006) was published by the Samsung Electronics Co. Ltd. In this case, with reduction in the size of the device, the width of a recessed region must be reduced, thus increasing the characteristic resistance of the device and the non-uniformity of the device.

The present inventor proposed a cell string composed of cell devices having no source/drain as in the case of the present invention in Korean Patent Appln. No 10-2006-0121143, entitled "High-Integration Flash Memory Cell String, Cell device, and Method of Manufacturing the Same." The present invention shows a modification of this patent. The present invention is intended to improve ON-current characteristics in a read operation by forming a buried insulating layer.

In this way, the development of new high-integration/high-performance flash memory device, capable of suppressing a short-channel effect attributable to a reduction in size and the deterioration of performance which are problems of the above-described existing published devices, has been required.

SUMMARY OF THE INVENTION

Accordingly, the present invention has been made keeping in mind the above problems occurring in the prior art, and an object of the present invention is to provide a flash memory cell device and a flash memory cell string, which realize excellent size reduction characteristics and excellent performance and have an existing flat channel structure, and a method of manufacturing the flash memory cell device and the flash memory cell string.

Another object of the present invention is to provide a structure for increasing a read current without requiring the source/drain in the flash memory cell string and the cell device, and the structure of a charge storage node for improving the characteristics of the device.

In accordance with a first aspect of the present invention to accomplish the above objects, there is provided a flash memory cell string, comprising a plurality of sequentially connected cell devices, and one or more switching devices arranged at ends of the connected cell devices and configured to select a specific cell string, wherein each of the cell devices comprises a semiconductor substrate; a first semiconductor thin film formed on the semiconductor substrate; a second semiconductor thin film formed on the first semiconductor thin film; a transmissive insulating layer, a charge storage node, and a control insulating layer sequentially formed on the second semiconductor thin film; a control electrode formed on the control insulating layer; and a buried insulating layer formed in a region of the first semiconductor thin film disposed between the cell device and an adjacent cell device.

Preferably, each of the switching devices comprises a semiconductor substrate, a first semiconductor thin film, and a second semiconductor thin film identical to those of the cell device, a gate stack formed on the second semiconductor thin film; a control electrode formed on the gate stack; a source or drain region formed in a region of the second semiconductor thin film located on a side not connected to the cell device; and a buried insulating layer formed in a region of the first semiconductor thin film located on either or both of sides of the control electrode of the switching device, wherein the gate stack is implemented as a single-layer insulating film, or is composed of a transmissive insulating layer, a charge storage node and a control insulating layer.

Preferably, the first semiconductor thin film has an etching ratio different from that of the semiconductor substrate, and the second semiconductor thin film has an etching ratio different from that of the first semiconductor substrate.

In accordance with a second aspect of the present invention to accomplish the above objects, there is provided a flash memory cell string, comprising a plurality of sequentially connected cell devices, and one or more switching devices arranged at ends of the connected cell devices and configured to select a specific cell string, wherein each of the cell devices comprises a semiconductor substrate; a transmissive insulating layer, a charge storage node, and a control insulating layer sequentially formed on the semiconductor substrate; a control electrode formed on the control insulating layer; and a buried insulating layer formed in a region of the semiconductor substrate disposed between the cell device and an adjacent cell device.

Preferably, each of the switching devices comprises a semiconductor substrate identical to that of the cell device; a gate stack formed on the substrate; a control electrode formed on the gate stack; a buried insulating layer formed on the semiconductor substrate disposed on either or both of sides of the control electrode of the switching device; and a source or drain region formed on a surface of the semiconductor substrate located on a side not connected to the cell device, wherein the gate stack is implemented as a single-layer insulating layer, or is composed of a transmissive insulating layer, a charge storage node and a control insulating layer.

In accordance with a third aspect of the present invention to accomplish the above objects, there is provided a flash memory cell string, comprising a plurality of sequentially connected cell devices, and one or more switching devices arranged at ends of the connected cell devices and configured to select a specific cell string, wherein each of the cell devices comprises a semiconductor substrate; a first semiconductor thin film formed on the semiconductor substrate; a second semiconductor thin film formed on the first semiconductor thin film; a transmissive insulating layer, a charge storage node, and a control insulating layer sequentially formed on the second semiconductor thin film; a control electrode formed on the control insulating layer; source and drain regions formed on the second semiconductor thin film disposed on both sides of the control electrode; and a buried insulating layer formed in a region of the first semiconductor thin film disposed between the cell device and an adjacent cell device, the buried insulating layer being formed below the source and drain regions.

Preferably, the first semiconductor thin film has an etching ratio different from that of the semiconductor substrate, and the second semiconductor thin film has an etching ratio different from that of the first semiconductor substrate.

Preferably, each of the switching devices comprises a semiconductor substrate, a first semiconductor thin film and a second semiconductor thin film identical to those of the cell device; a gate stack formed on the second semiconductor thin film; a control electrode formed on the gate stack; and source and drain regions formed in regions of the second semiconductor thin film disposed on both sides of the control electrode, wherein the gate stack is implemented as a single-layer insulating layer, or is composed of a transmissive insulating layer, a charge storage node and a control insulating layer.

In accordance with a fourth aspect of the present invention to accomplish the above objects, there is provided a flash memory cell string, comprising a plurality of sequentially connected cell devices, and one or more switching devices arranged at ends of the connected cell devices and configured to select a specific cell string, wherein each of the cell devices comprises a semiconductor substrate; a transmissive insulating layer, a charge storage node and a control insulating layer sequentially formed on the semiconductor substrate; a control electrode formed on the control insulating layer; source and drain regions formed on a surface of the semiconductor substrate disposed on both sides of the control electrode; and a buried insulating layer formed in a region of the semiconductor substrate disposed between the cell device and an adjacent cell device, the buried insulating layer being formed below the source and drain regions.

Preferably, each of the switching devices comprises a semiconductor substrate identical to that of the cell device; a gate stack formed on the semiconductor substrate; a control electrode formed on the gate stack; and source and drain regions formed in a region of the semiconductor substrate disposed on both sides of the control electrode, wherein the source and drain regions are formed not to overlap the control electrode, or, alternatively, a source or drain region located on a side connected to the cell device is formed not to overlap the control electrode of the switching device and a source or drain region located on a side not connected to the cell device is formed to overlap the control electrode of the switching device.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B are sectional views showing a flash memory cell and a cell string, respectively, according to an embodiment of the present invention, wherein FIG. 1A illustrates a sectional view in which source/drain are formed not to overlap control electrodes in switching devices placed at the ends of the cell string, and FIG. 1B illustrates a sectional view in which source/drain are formed to overlap the control electrodes;

FIGS. 2A and 2B are sectional views according to another embodiment of the present invention in which only an insulating layer for assisting the formation of an inversion layer is included in a silicon surface between respective cells, wherein FIG. 2A illustrates a sectional view in which source/drain are formed not to overlap control electrodes in switching devices placed at the ends of a cell string, and FIG. 2B illustrates a sectional view in which source/drain are formed to overlap the control electrodes;

FIGS. 3A and 3B illustrate the sections of some cells in the sectional views of the strings of FIGS. 1 and 2, in which when a cell device is turned on, schematic fringing electric fields indicated by arrows are formed on the side surfaces of control electrodes and floating electrodes, and an inversion layer is induced on the silicon surface between respective cells;

FIGS. 4A and 4B are diagrams showing modifications of the string structures of FIGS. 1A and 1B according to the present invention, in which an insulating layer is formed below source/drain regions which are not adjacent to cells in switching devices placed at both ends of a cell string, wherein FIG. 4A illustrates a structure in which source/drain which are not adjacent to cells are formed not to overlap gate electrodes or control electrodes in switching devices, and FIG. 4B illustrates a structure in which the source/drain are formed to overlap the gate electrodes or the control electrodes;

FIGS. 5A to 5D are views showing modifications of the structure of a floating electrode according to the present invention, wherein FIG. 5A illustrates a plan view showing part of a cell string and a word line, for example, a 2×2 array, FIG. 5B illustrates a sectional view of the array viewed in the direction of a word line, and FIGS. 5C and 5D illustrate sectional views of the array viewed in the direction of a cell string;

FIGS. 6A and 6B are sectional views of a floating electrode viewed in the same direction as that of FIG. 5B, a difference being in the floating electrodes therebetween, wherein FIG. 6A illustrates a structure in which another "T"-shape structure is stacked on the "T"-shape structure of FIG. 5B, and FIG. 6B illustrates a structure in which "T"-shape structures are stacked upwards as three layers;

FIGS. 7A to 7C are sectional views of modified floating electrodes, wherein FIG. 7A illustrates the section of a "T"-shape structure, FIG. 7B illustrates the section of a structure in which "T"-shape structures are stacked, and FIG. 7C illustrates the section of a structure in which "T"-shape structures are stacked as multiple layers;

FIGS. 8A and 8B are views showing part of the section of the strings of FIGS. 1 and 2, in which insulating materials having different dielectric constants are formed on and around the cells, wherein FIGS. 8A and 8B illustrate part of the cells of FIGS. 1 and 2, in which insulating materials having different dielectric constants are formed between respective cells, and in which fringing fields, formed on the side surfaces of control electrodes or floating electrodes when a cell device is turned on, are indicated on the insulating materials by arrows;

FIGS. 9A and 9B are sectional views of modifications of the structures of FIGS. 4A and 4B according to the present invention, which show sections in which source/drain regions are formed not to overlap the control electrodes of cell devices, wherein FIG. 9A illustrates a structure in which source/drain which are not adjacent to cells are formed not to overlap gate electrodes or control electrodes in switching devices, and FIG. 9B illustrates a structure in which the source/drain are formed to overlap the gate electrodes or the control electrodes;

FIG. 12 is a graph showing the characteristics of a brief cell device string provided to exhibit the effects of the present invention, which shows a drain current flowing through the string when the device is turned on.

DESCRIPTION OF THE PREFERRED EMBODIMENTS

Figure 1:
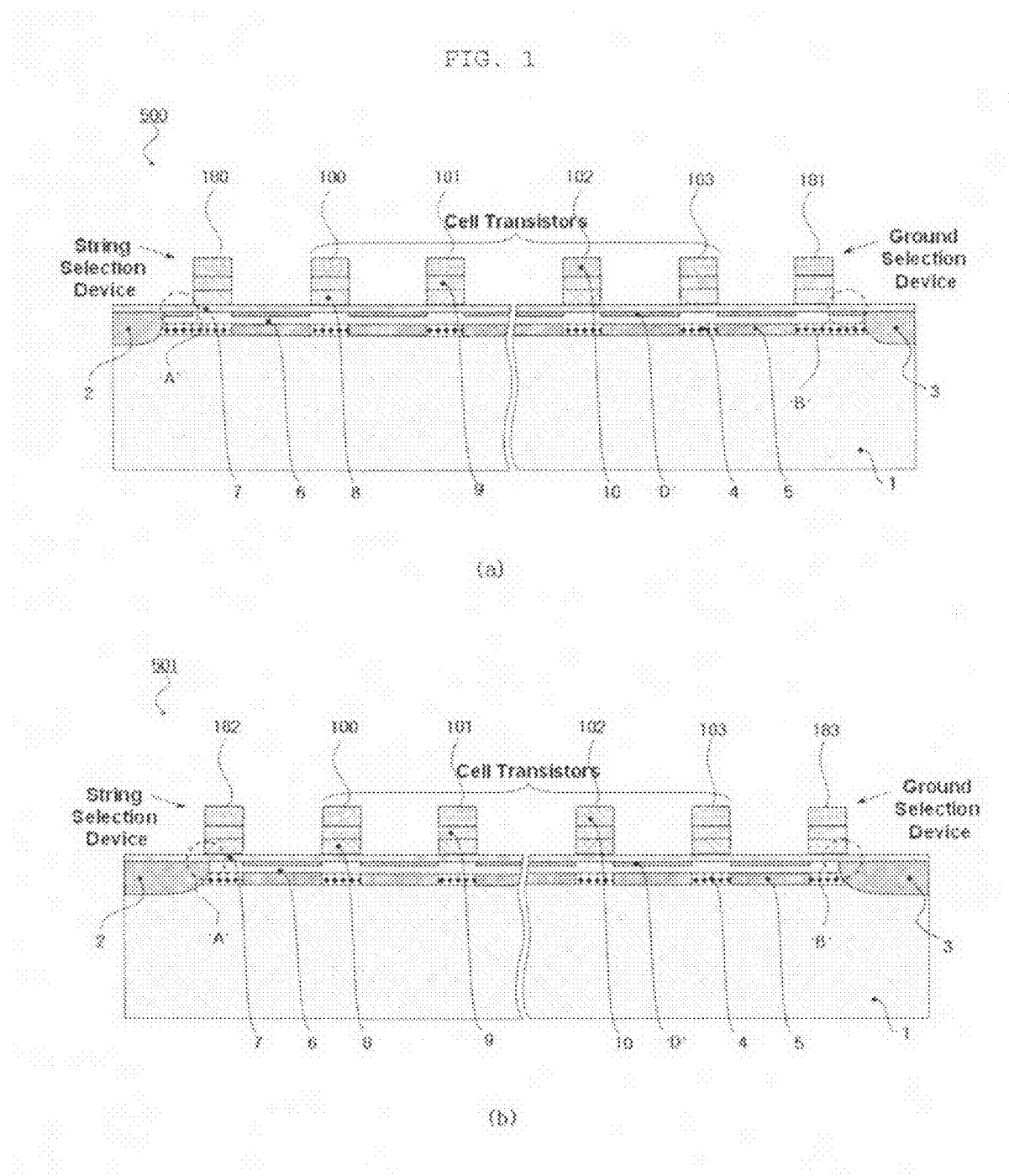

Hereinafter, the structure and operation of a high-integration NAND flash memory cell string according to embodiments of the present invention will be described in detail with reference to the attached drawings. From the drawings, insulating layers, contacts, metal wires, etc. are excluded in order to clearly show the principal characteristics of the present invention.

FIGS. 1A and 1B are sectional views of a NAND flash memory cell string according to embodiments of the present invention. Referring to FIG. 1A, a flash memory cell string 500 according to an embodiment of the present invention includes a plurality of cell devices (cell transistors) 100, 101, 102 and 103, a first switching device 180, and a second switching device 181. Referring to FIG. 1B, a flash memory cell string 501 according to another embodiment of the present invention includes a plurality of cell devices 100, 101, 102 and 103, a first switching device 182 and a second switching device 183. The difference between FIGS. 1A and 1B is in the switching devices. In FIG. 1A, the switching devices 180 and 181 are not provided with a source or drain region on a side connected to an adjacent cell device, and are configured such that a source or drain region on a side not connected to the cell device is formed not to overlap control electrodes, as shown in 'A' and 'B' indicated by circles of dashed lines. The switching devices 182 and 183 in FIG. 1B are not provided with a source or drain region on a side connected to an adjacent cell device, and are configured such that a source or drain region on a side not connected to a cell device is formed to overlap the control electrodes, as shown in 'A' and 'B' indicated by circles of dashed lines. In FIGS. 1A and 1B, each SiGe layer 4 and each buried insulating layer 5 are formed near the surface of a semiconductor substrate 1. On these regions, a semiconductor thin film 6, preferably, a silicon thin film, is formed. 'D' denotes an inversion layer, which is induced in such a way that, when a voltage for read is provided to such a control electrode 10, fringing electric fields flow from the side surfaces of the control electrode 10. If each charge storage node 8 is made of a conductive material, the voltage of the control electrode 10 is coupled to the charge storage node, so that fringing electric fields also flow from the side surfaces of the charge storage node, thus assisting the induction of the inversion layer "D". The inversion layer may replace the source/drain regions in the operation of flash memory. In an existing cell string, the source/drain regions are formed on a semiconductor region between neighboring cells or between neighboring control electrodes 10, but are formed to overlap the control electrodes. The source/drain are removed, and the functions thereof are replaced with the induced inversion layer 'D', thus greatly improving the size reduction characteristics of the device. In particular, the buried insulating layer 5 formed on the semiconductor substrate between neighboring cells or between neighboring control electrodes 10 is characterized in that it facilitates the formation of the inversion layer, thus greatly increasing the magnitude of current when current must flow through the cell string. In particular, when cell devices and the switching devices are implemented as N-type MOSFETs, positive interface charges existing on the interface between the buried insulating layer and the semiconductor substrate further facilitates the induction of the inversion layer. The semiconductor thin film 6 is less doped to increase carrier mobility in a channel, thus enabling high current to flow when all cell devices are turned on.

FIGS. 2A and 2B illustrate cell strings having structures similar to those of FIGS. 1A and 1B according to the present invention. In FIG. 2A, a source or a drain on a side which is not adjacent to a cell device around the control electrodes 10 of switching devices 280 and 281 is formed not to overlap the control electrodes 10. In FIG. 2B, a source or a drain on a side which is not adjacent to a cell device around the control electrodes 10 of switching devices 282 and 283 is formed to overlap the control electrodes 10. In FIGS. 2A and 2B, the SiGe layer 4 of FIGS. 1A and 1B is eliminated. When the device is turned on, an inversion layer 'D' is formed on the same principle as that of FIGS. 1A and 1B. As described above with reference to FIGS. 1A and 1B, each buried insulating layer 5 is characterized in that it facilitates the formation of the inversion layer 'D', thus greatly increasing the magnitude of current when current must flow through the cell string. Except that the SiGe layer does not exist, the characteristics of FIGS. 1A and 1B are almost equally applied to FIGS. 2A and 2B. Here, the existence of the SiGe layer may influence electrical characteristics or manufacturing processes, but does not greatly influence the characteristics of the present invention. In particular, since the SiGe layer is etched well compared to a silicon layer during manufacturing processes, the buried insulating layer 5 can be effectively implemented using these characteristics.

Figure 2:
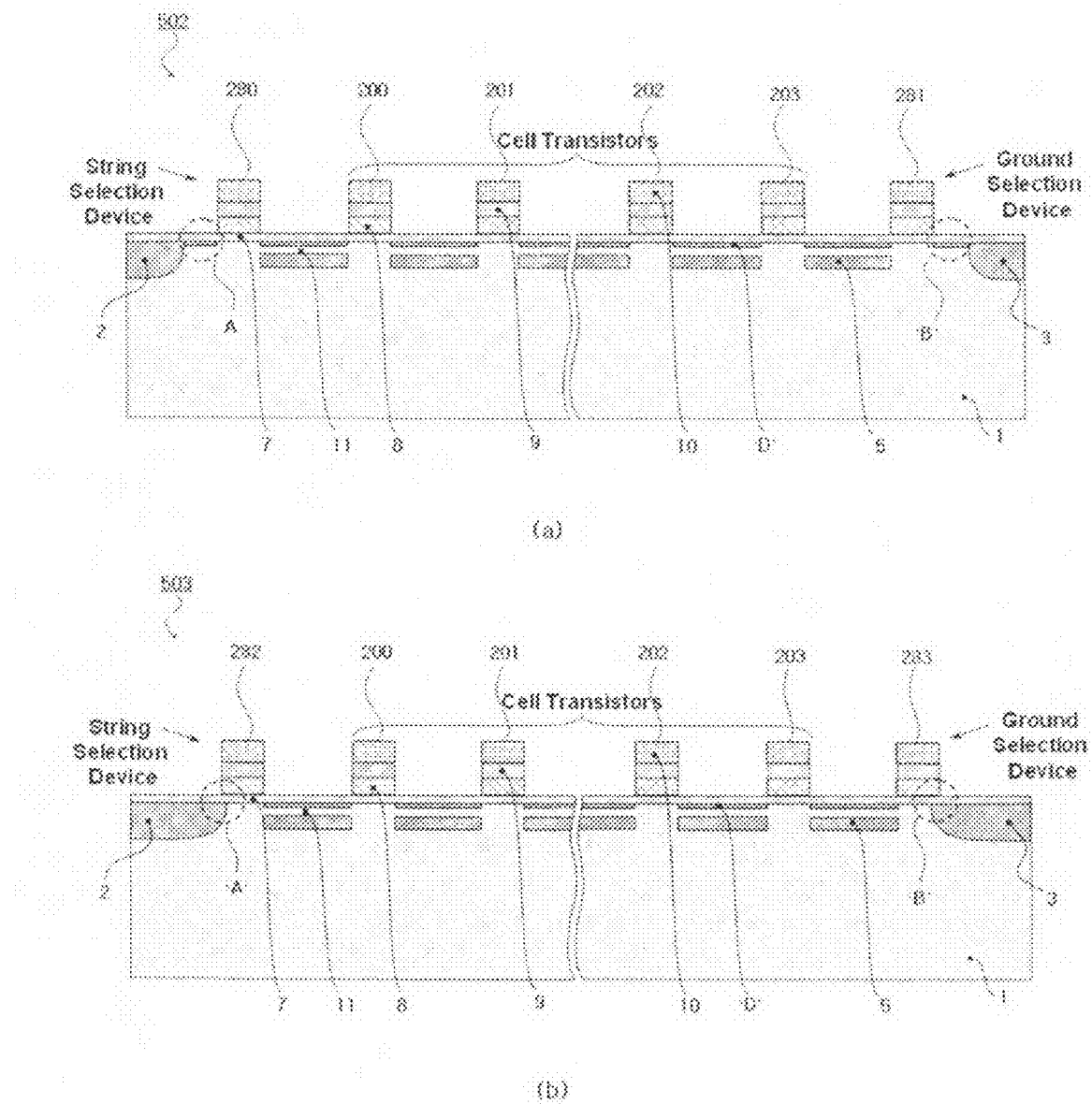

FIGS. 3A and 3B are sectional views of two cell devices in the cell strings of FIGS. 1 and 2, respectively. Arrows indicated by dotted lines in FIGS. 3A and 3B denote fringing electric fields flowing from the side surfaces of control electrodes 10 and conductive charge storage nodes 8. When an insulating charge storage node such as a nitride film, instead of such a conductive charge storage node 8, is used, fringing electric fields mainly flow from the control electrodes 10. A description of the cells given with reference to FIGS. 1 and 2 is equally applied.

Figure 4:
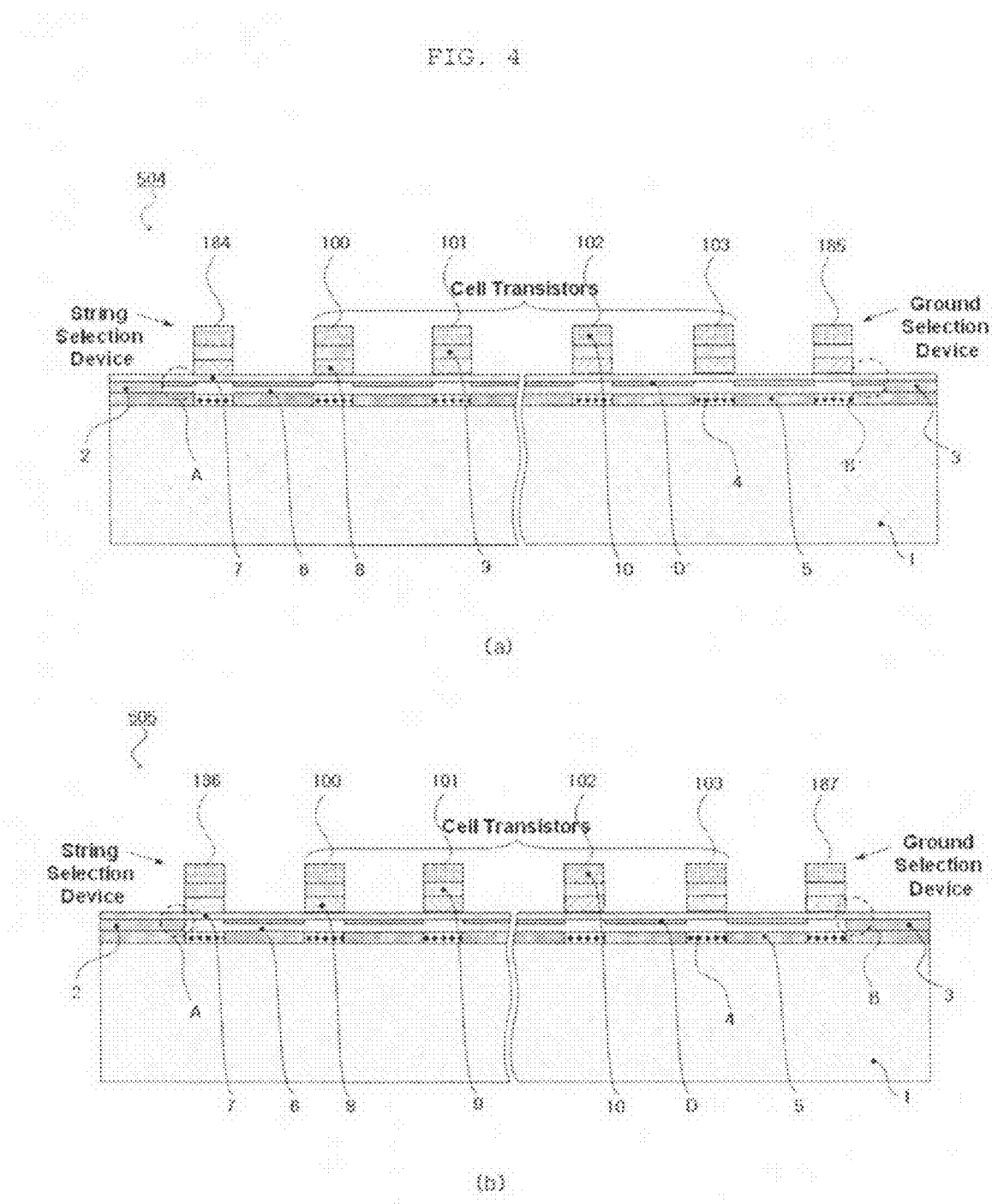

FIGS. 4A and 4B are sectional views showing modifications of the cell strings of FIGS. 1A and 1B. FIGS. 4A and 4B correspond to FIGS. 1A and 1B, respectively, but there is a difference therebetween in that a buried insulating layer 5 is formed in a region which is not adjacent to cell devices around the control electrodes 10 of switching devices. Basically, the switching devices 184 and 185 of FIG. 4A are not provided with a source or drain region on a side connected to an adjacent cell device, and are configured such that a source or a drain region on a side not connected to the cell devices is formed not to overlap the control electrodes, as shown in 'A' and 'B' indicated by circles of dotted lines. In FIG. 4B, switching devices 186 and 187 are not provided with a source or drain region on a side connected to adjacent cell devices, and are configured such that a source or drain region on a side not connected to the cell devices is formed to overlap the control electrodes, as shown in 'A' and 'B' indicated by circles of dotted lines.

Figure 5:
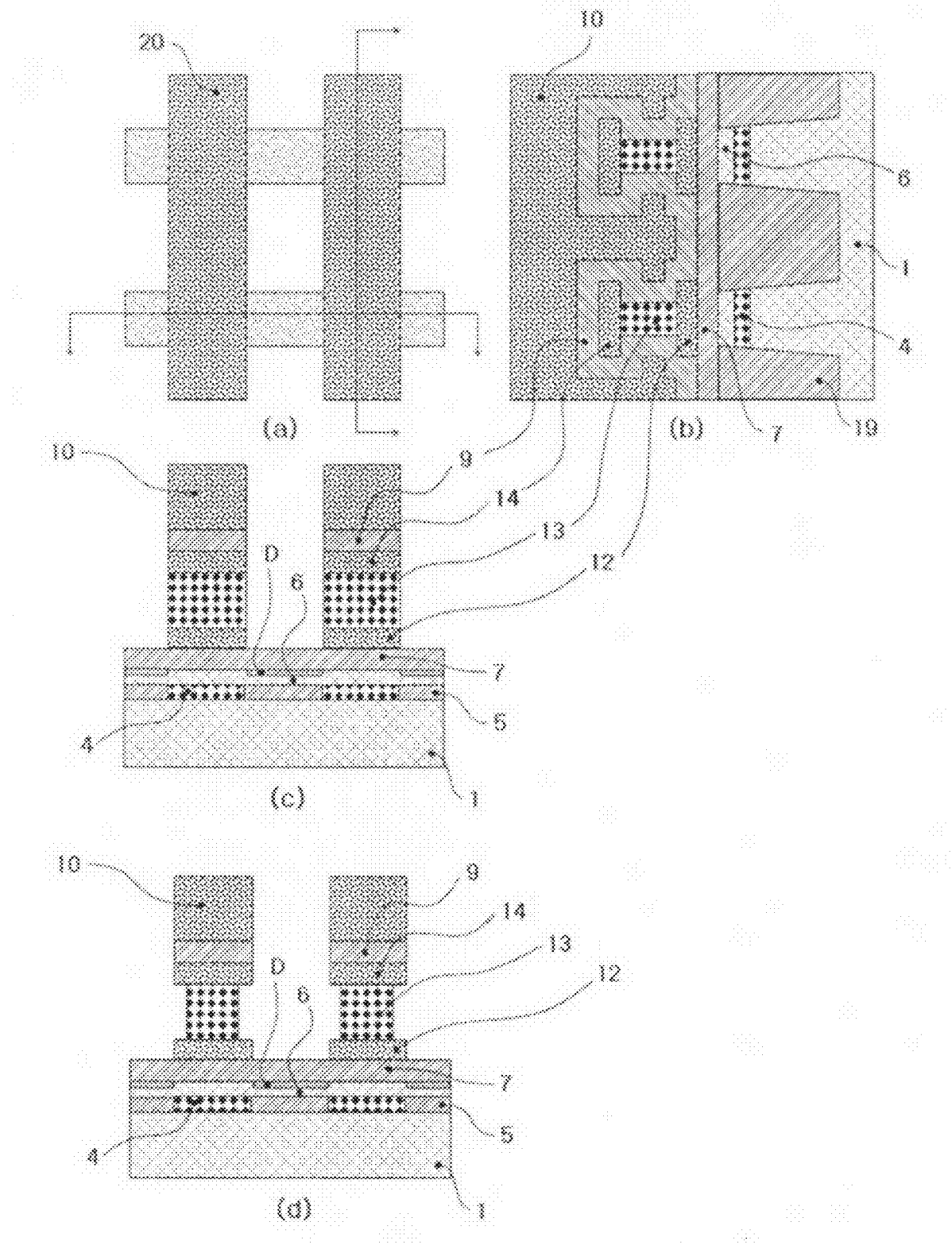

FIGS. 5A to 5C are a plan view of a 2×2 array, which is part of a cell array, a sectional view of the array viewed in the direction of a word line, and a sectional view of the array viewed in the direction of a cell string, respectively. In FIG. 5A, word lines 20 are configured to be connected to the control electrodes 10 of respective cells, for example, in a direction perpendicular to a string. FIG. 5B is a sectional view of the array viewed in the direction of a word line 20, in which a charge storage node is composed of conductive regions 12, 13 and 14 made of materials having different characteristics and is formed in a shape similar to an English letter "I". The material of the region 13 has characteristics different from those of the regions 12 and 14. For example, the charge storage node may be configured such that the regions 12 and 14 are made of poly silicon and the region 13 is made of poly SiGe.

Hereinafter, a manufacturing process for forming the above-described structure will be briefly described. A transmissive insulating layer 7 is formed, and the materials of the regions 12, 13 and 14 are sequentially stacked. The regions 12, 13 and 14 are etched using a mask for defining the charge storage node. A SiGe layer is selectively etched through the etched side surface through wet-type or dry-type etching, and a control insulating layer is formed, and thereafter, the control electrode is formed. When the structure is cut along the word line 20, the section of FIG. 5B is obtained. As shown in FIG. 5B, the conductive charge storage node is formed in an "I" shape, so that the coupling ratio between the control electrode 10 and the conductive charge storage node can be increased, thus improving program speed or erase speed. Further, an increase in the coupling ratio may suppress a short-channel effect, may decrease a threshold voltage, and may reduce crosstalk between neighboring cells. In FIG. 5B, a region 19 is a region for isolating respective devices. FIG. 5C illustrates the section viewed in the direction of a cell string. The section of FIG. 5C is similar to that of the cell device of the cell string of FIGS. 1A and 1B, but the construction of a charge storage node is different from that of FIGS. 1A and 1B. That is, the region 8 of FIGS. 1A and 1B is provided to representatively indicate the charge storage node. In FIGS. 5A to 5D, the charge storage node is formed in a three-layer structure. The "I"-shape charge storage node shown in FIGS. 5A to 5D is implemented in the cell string of FIGS. 1A and 1B, but may be equally implemented in the cell string of FIG. 2 or 4. FIG. 5D illustrates a structure in which the control electrode is formed and a SiGe layer exposed to the side surfaces of the control electrode is selectively partially etched. When this structure is formed, the coupling ratio between the control electrode and the charge storage node (composed of regions 12, 13 and 14 of FIGS. 5A to 5D) is slightly decreased, but crosstalk between neighboring cells can be further decreased. This structure may be applied to all of the structures of conductive charge storage nodes shown in the following drawings.

In FIG. 5B, a patterned semiconductor region between a region in which the channels of a cell device and a switching device are formed and a semiconductor substrate 1 is called a body. The width of the body may be entirely uniform or increase in a direction from the surface toward the semiconductor substrate 1, or may be uniform in the upper portion of the body and gradually increase toward the lower portion of the semiconductor substrate. A corner at which the body and the semiconductor substrate 1 meet is formed so as not to cause a problem in integration and, preferably, may be formed to be round. When the width of the body linearly or non-linearly increases in a direction from the surface toward the semiconductor substrate 1, the resistance of the body can be reduced, so that the structure may be operated to be beneficial for an erase operation among the operations of NAND flash memory. The body in FIG. 5B may be formed such that the width thereof increases linearly toward the semiconductor substrate 1. The structure of the body is applied to all of the cell devices and switching devices included in the present patent.

FIGS. 6A and 6B illustrate structures in which the "I"-shape charge storage node of FIG. 5B is extended. In FIG. 5B, the "I"-shape structure is implemented as a single layer, but in FIG. 6A, a two-layer "I"-shape charge storage node is implemented, and in FIG. 6B, a multi-layer "I"-shape charge storage node is implemented. When the multi-layer "I"-shape structure is implemented, the coupling ratio between the control electrode 10 and the conductive charge storage node can be further improved. As described above, an increase in the coupling ratio may further improve the characteristics of devices.

FIGS. 7A, 7B, and 7C illustrate the structures of conductive charge storage nodes having structures similar to those of FIG. 5B, FIG. 6A and FIG. 6B, respectively. In FIG. 7A, a charge storage node made of a two-layer conductive material has a shape similar to an English letter "T". In FIG. 7A, the conductive thin film 12 existing in FIG. 5B or FIGS. 6A and 6B is eliminated, so that capacitance between the patterned region of the semiconductor thin film 6 and the charge storage node is reduced, and an area in which capacitance is formed between the control electrode 10 and the charge storage node is increased. Therefore, the coupling ratio between the control electrode 10 and the conductive charge storage node is increased, thus enabling the characteristics of the cell device to be improved. In FIGS. 7B and 7C, "T"-shape conductive charge storage nodes are implemented as a two-layer structure and a multi-layer structure, respectively, thus further increasing the coupling ratio.

Figure 7:
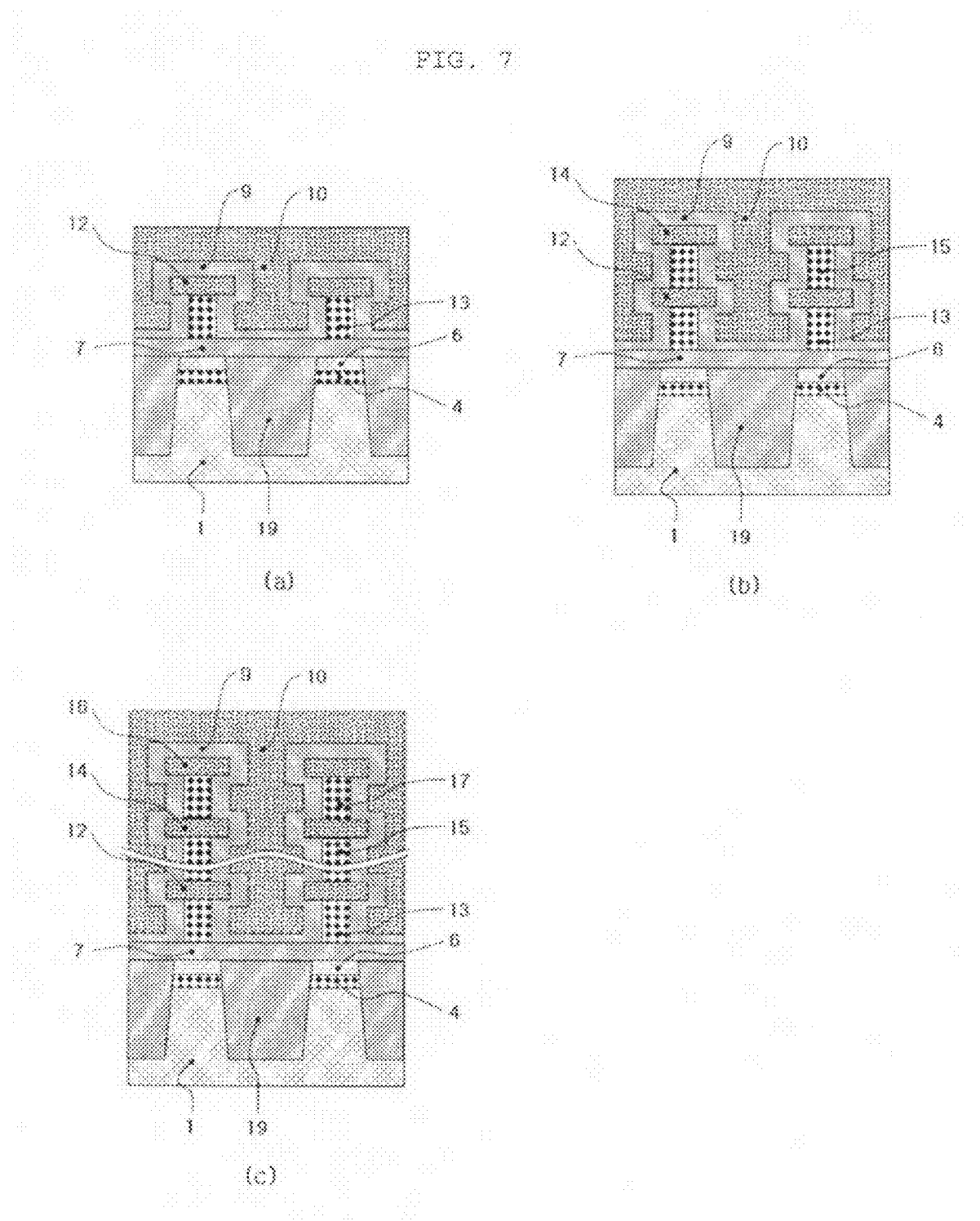

In FIGS. 6 and 7, the structure of the conductive charge storage node is implemented as an "I"-shape or a "T"-shape, so that the area of the conductive charge storage node in the direction of a channel width can be effectively reduced, and thus crosstalk between respective cells can be reduced. It is apparent that the structure of the "T" or "I"-shape charge storage node can be modified depending on the difference between the heights of the surface of a patterned semiconductor and the surface of a field insulating layer 19. For example, in the case where the height of the surface of the field insulating layer is greater than that of the patterned semiconductor, the shape of first polysilicon may be similar to a "T"-shape if the polysilicon is formed first, a subsequent layer is formed, and the charge storage node is patterned.

Referring to FIG. 8A, the section of a structure in which an additional insulating layer is formed in some cell devices of the cell string of FIG. 1 is depicted. After the shown control electrodes 10 are formed, spacers 21 are formed on the sidewalls of each control electrode 10, and a second insulating layer 22 having a high dielectric constant is formed between cell devices. Thereafter, a third insulating layer 23 is formed on the entire portion of a resulting product, so that the structure of the device is implemented. The dielectric constant of the spacers 21 and the dielectric constant of the second insulating layer 22 can be adjusted, thus enabling the inversion layer 'D' attributable to fringing electric fields to be easily induced by the adjustment of the dielectric constants. FIG. 8B illustrates the section of a structure in which an additional insulating layer is formed in some cell devices of the cell string of FIG. 2. A description of FIG. 8A is equally applied to FIG. 8B.

Figure 9:
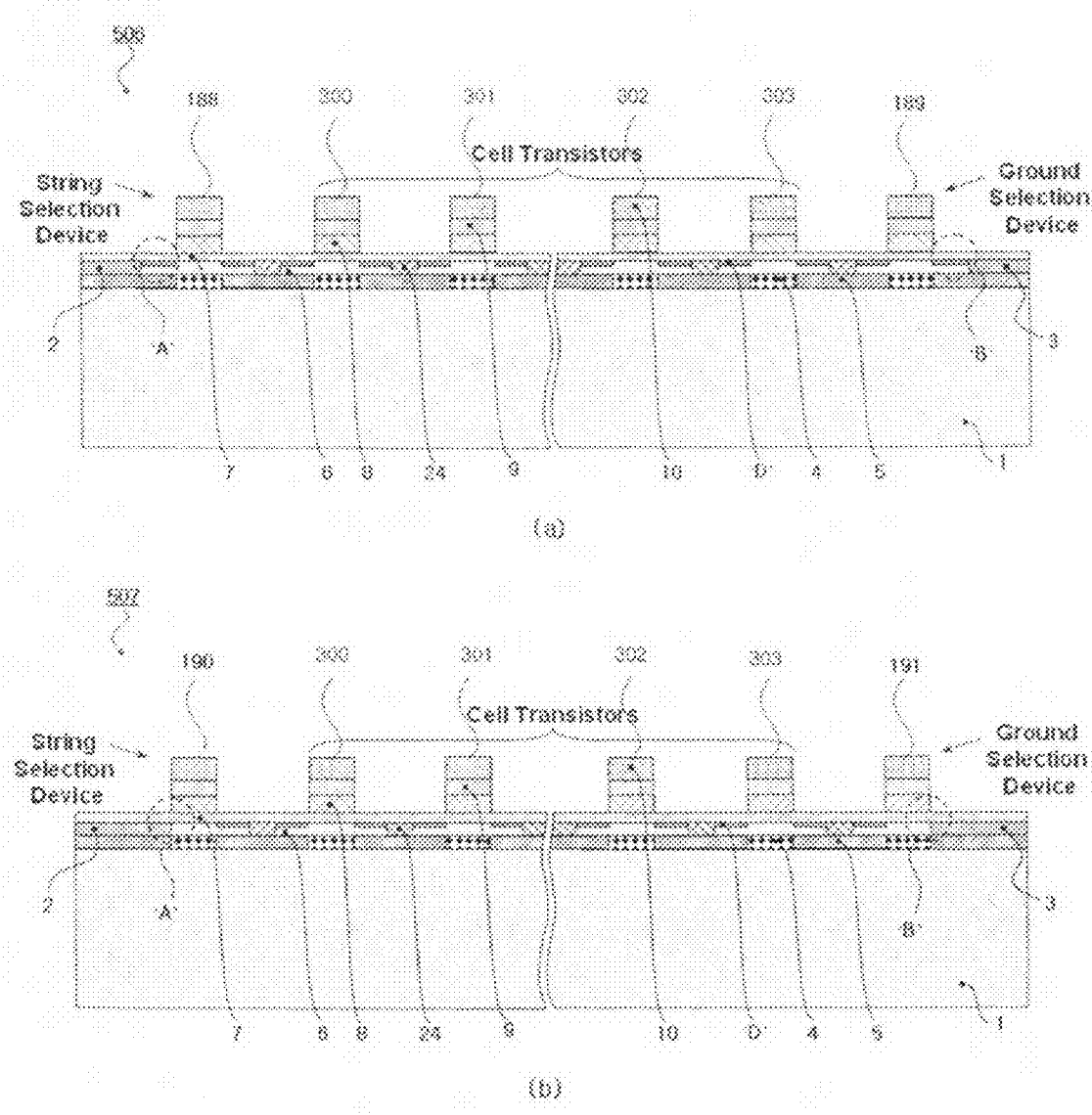

FIGS. 9A and 9B are sectional views of cell strings, which show structures similar to those of the cell strings of FIGS. 1A and 1B. However, there is a difference in that the source/drain 24 of each cell device are formed not to overlap control electrodes. The distance between such a control electrode 10 and the source/drain that do not overlap each other, that is, a separation distance, is 0.1 nm to 100 nm. The junction depth of the source/drain may be formed within a range from 2 nm to 100 nm. In FIG. 9A, switching devices 188 and 189 are configured such that the source/drain thereof are formed not to overlap control electrodes, as shown in 'A' and 'B' indicated by circles of dotted lines. In FIG. 9B, switching devices 190 and 191 are configured such that the source/drain thereof are formed to overlap the control electrodes of the switching devices, as shown in 'A' and 'B' indicated by circles of dotted lines. In FIGS. 9A and 9B, the source/drain 24 are formed not to overlap the control electrodes in respective cell devices, so that current can sufficiently flow through the cell string when the flow of current through the cell string is required while a short-channel effect is suppressed.

A flash memory cell device and a flash memory cell string according to the present invention having the above-described characteristics may additionally have the following characteristics.

In each switching device, the source or drain region 3 on a side not connected to cell devices may be doped at a higher density than that of the source and drain regions 24 of the cell devices.

A gate insulating layer formed below the control electrode of the switching device may be composed of a transmissive insulating layer 7, a charge storage node 8 and a control insulating layer 9, which are identical to those of the cell device, or may be implemented as a single-layer or multi-layer insulating layer.

The transmissive insulating layer 7 is implemented as a single-layer or multi-layer insulating film. When the transmissive insulating layer is implemented as the multi-layer insulating film, it may be composed of materials having various dielectric constants and band gaps.

The charge storage node 8 may be implemented using a single-layer conductive material or a multi-layer conductive material having one or more layers. When the charge storage node is implemented as a multi-layer structure, it is composed of two or more types of conductive materials having different etching selectivity values, and a semiconductor material having high etching ratio is selectively further etched, thus enabling the charge storage node to be formed in a single-layer or multi-layer "T" shape or "I" shape in the section of the cell viewed in the direction of a word line.

Further, the charge storage node 8 is implemented as a single-layer insulating thin film or a multi-layer insulating thin film having two or more layers, and such an insulating thin film includes a nitride film or a metal oxide. The charge storage node implemented using a multi-layer insulating material may be made of materials having different dielectric constants or band gaps.

The control insulating layer 9 may be implemented as a single-layer or multi-layer insulating film. When the control insulating layer 9 is implemented as a multi-layer structure, it may be made of materials having different dielectric constants or band gaps.

The control electrode 10 may be made of a single-layer or multi-layer conductive material. When the control electrode 10 is made of multi-layer material, it may be composed of different work functions. Materials constituting the control electrode may be one or more of Si, poly Si, poly Ge, poly SiGe, amorphous Si, amorphous Ge, amorphous SiGe, a metal oxide, metal, a metal nitride, and silicide, each doped with P-type or N-type material having a higher density.

In a cell string including the source/drain 24 of the cell device and the source or drain of the switching device, the source and drain regions may exist in the cell device and/or the switching device, but the separation distance between the source and drain regions and an adjacent control electrode may be 0.1 nm to 100 nm, and the depth of the source and drain junctions may be formed within a range of 2 nm to 100 nm from the surface of the semiconductor substrate.

The doping density of a channel formed below the control electrode 10 is formed to be higher than the doping density of a portion other than the channel, thus suppressing a short-channel effect.

The length of the buried insulating layer 5 may be longer or shorter than the distance between neighboring control electrodes.

In the cell device and the switching device, the width of the body may be uniform or increase in a direction from the surface, on which the channel is formed, toward the semiconductor substrate 1, or may be uniform in the upper portion of the body and gradually increase toward the lower portion of the body. A corner at which the body and the semiconductor substrate 1 meet is formed so as not to cause a problem in integration and, preferably, may be formed to be round.

A single crystal semiconductor thin film 6 is formed on the buried insulating layer 5, and the thickness of the semiconductor thin film may be within a range from 1 nm to 100 nm.

Preferably, the length of the gate or the control electrode of the switching device is formed to be similar to or longer than that of the cell device, thus enabling the occurrence of a short-channel effect to be reduced in the switching device. The reason for this is that, when a short-channel effect occurs in the switching device, unlike the cell device, a specific cell string is selected through the switching device, and that, when a specific cell is read, the leakage current of unselected cell strings may be added to current flowing through the selected cell string. In this case, it is not possible to accurately read information stored in the selected cell.

Hereinafter, the structure and operation of the switching device of the flash memory cell string according to other characteristics of the present invention are described in detail. The flash memory cell string according to the present invention includes a plurality of cell devices and switching devices arranged at both ends of the cell devices. In such a switching device, a source or a drain is not formed on a side connected to the cell devices, and is formed only on a side not connected to the cell devices. In such a switching device, the source or drain formed on the side not connected to the cell device may be formed to overlap or not to overlap the control electrodes.

A switching device in the flash memory cell string according to another embodiment of the present invention is constructed such that a source or drain region is provided both on a side connected to the cell devices and on a side not connected to the cell devices and is formed not to overlap the control electrodes.

A switching device in the flash memory cell string according to a further embodiment of the present invention is configured such that a source or drain region is provided both on a side connected to the cell devices and a side not connected to the cell devices, and such that the source or drain region on the side connected to the cell devices is formed not to overlap the control electrodes and the source or drain region on the side not connected to the cell devices is formed to overlap the control electrodes. Other characteristics of the switching device are identical to those of the above-described switching devices.

The above-described switching devices according to various embodiments are configured such that buried insulating layers are formed in semiconductor regions on both sides of the control electrode, but may be formed to either overlap or not to overlap the control electrodes. Further, a buried insulating layer may be formed in a semiconductor region on a side connected to the cell devices around the control electrodes, or may be formed in a semiconductor region on a side not connected to the cell devices.

Hereinafter, the principal process among processes for manufacturing the flash memory cell string having the above-described structure is described in detail.

Now, the principal process for implementing the structure of the present invention will be briefly described. Hereafter, with reference to FIG. 10, the principal processing steps according to the present invention are sequentially described. First, the principal processing steps for manufacturing the structure shown in the cell string of FIG. 1 according to the present invention are described below.

At step (a), first, a SiGe thin film 4 is formed on a semiconductor substrate 1, and a silicon thin film 6 is formed thereon. Thereafter, at step (b), a device isolation region called a field insulating layer 19 is formed on the semiconductor substrate, the SiGe thin film and the silicon thin film. At step (c), a transmissive insulating layer 7 is formed on the resulting product of (b), at step (d), a charge storage node 8 is formed on the resulting product of (c), and at step (e), a control insulating layer 9 and a control electrode 10 are sequentially formed on the resulting product of (d). Thereafter, at step (f), a buried insulating layer is formed in a semiconductor region between respective control electrodes. At step (g), source/drain are formed in the device of the regions other than the regions of cell devices. Thereafter, at step (h), an interlayer insulating layer is formed on the resulting product of (g). At step (i), contacts are formed at a place requiring contacts in the device of the regions other than the regions of the cell devices, and metal layers are sequentially formed. Through these steps, the cell string is manufactured. Thereafter, additional insulating layers, via holes, and metal wiring layers may be formed as needed.

After step (f), the step of forming insulating layer spacers having a high dielectric constant on the sidewalls of the control electrode and facilitating the induction of an inversion layer attributable to fringing electric fields may be further included. Alternatively, after step (f), the step of forming insulating layer spacers on the sidewalls of the control electrode, injecting ions required for the formation of the source/drain regions of the cell device, and forming the source/drain regions not overlapping the control electrode may be further included.

Figure 10:
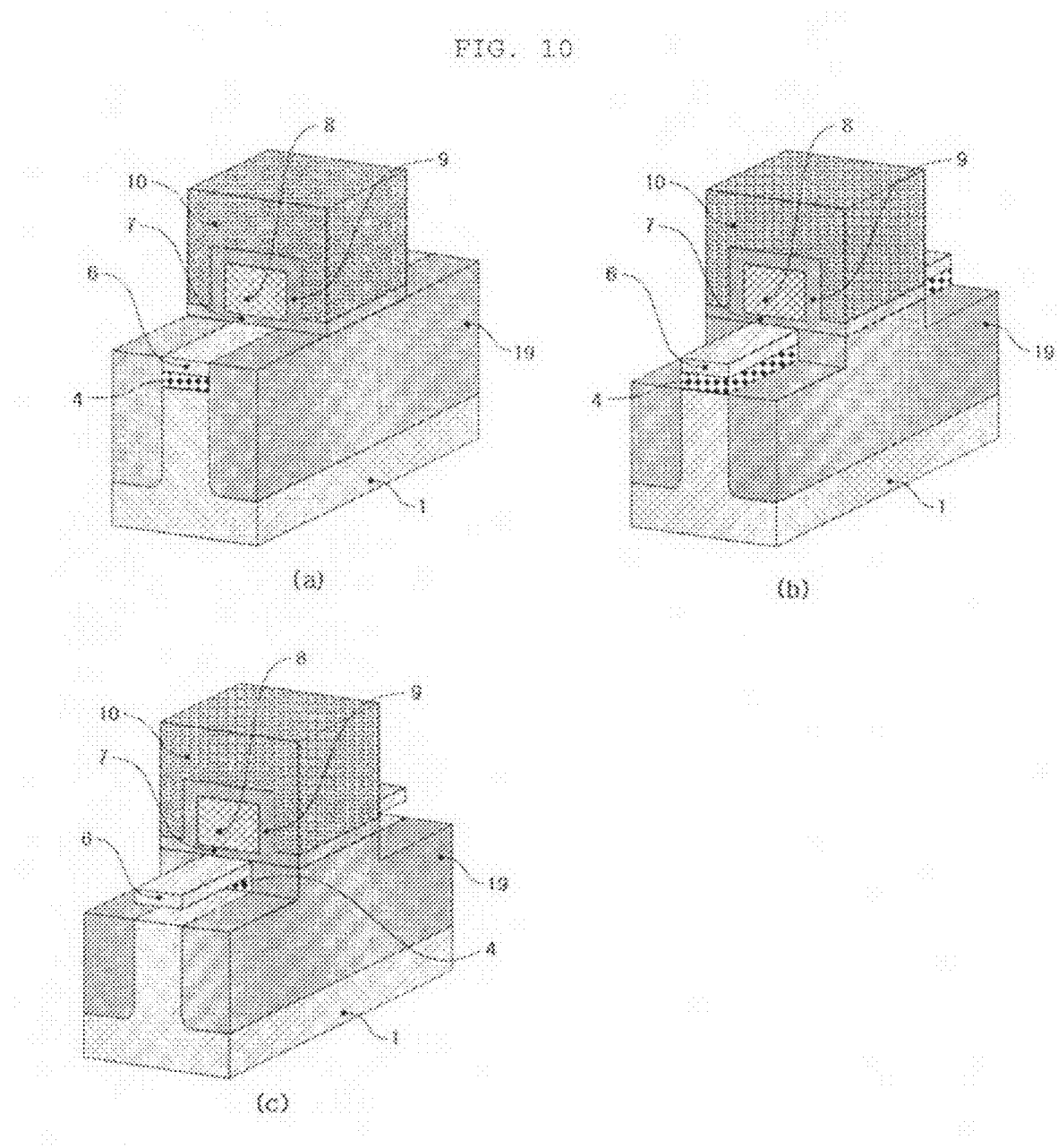
FIGS. 10A to 10C are views showing core processing steps for implementing the structure of FIG. 1 according to the present invention, which show principal processes on the basis of only a single cell device in a cell string.

A process for implementing step (f) will be described in detail with reference to FIG. 10. FIG. 10A is a three-dimensional perspective view of a structure obtained after even the control electrode 10 has been formed. Here, the field insulating layer 19, which is a device isolation region, is additionally etched so that the side surfaces of the SiGe layer 4 are exposed. This step is shown in FIG. 10B. In this state, the side surfaces of the SiGe layer are selectively etched, so that the SiGe layer is eliminated from the semiconductor region between the relevant control electrode 10 and an adjacent control electrode 10. This step is shown in FIG. 10C. A thin thermal oxide film is grown and an insulating layer is deposited, so that they fill a portion from which the SiGe layer is eliminated, and thus a buried insulating layer 5 can be formed. Further, an insulating layer may be deposited at the step of FIG. 10C, and thus the buried insulating layer may be formed. If the SiGe layer is included in the charge storage node 8, a spacer is formed using a thin insulating layer after step (f), so that the exposed surface of the charge storage node 8 is covered, and thereafter subsequent processes may be performed.

Hereinafter, with reference to FIGS. 11A to 11E, a process for manufacturing a cell string according to the characteristics of FIG. 2 of the present invention is described. First, principal processing steps for the structure of the present invention shown in the cell string of FIG. 2 are described below.

At step (a), a field insulating layer 19, which is a device isolation region, is formed on a semiconductor substrate, and at step (b), a transmissive insulating layer 7 is formed on the resulting product of (a). At step (c), a charge storage node 8 is formed on the resulting product of (b). At step (d), a control insulating layer 9 and a control electrode 10 are sequentially formed on the resulting product of (c). At step (e), a buried insulating layer is formed in a semiconductor region between respective control electrodes, and at step (f), source/drain regions are formed in the device of regions other than the regions of cell devices. Thereafter, at step (g), an interlayer insulating layer is formed on the resulting product of (f). At step (h), contacts are formed at a place requiring contacts in the device of regions other than the regions of cell devices, and metal layers are sequentially formed, so that the cell string is manufactured. Thereafter, additional insulating layers, via holes, and metal wiring layers may be formed as needed.

Figure 11:
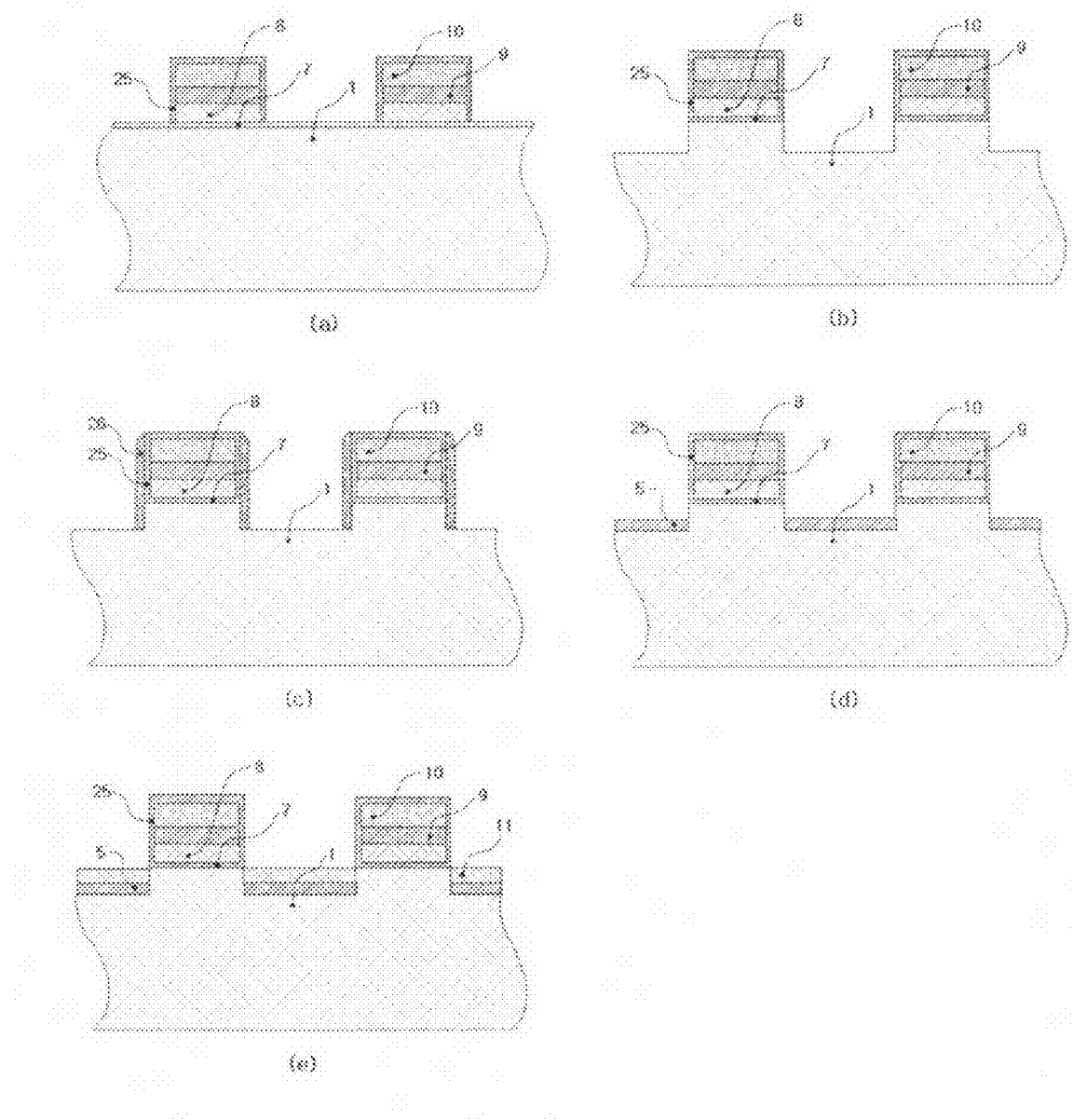
FIGS. 11A to 11E are views showing core processing steps of the modification of FIG. 2 according to the present invention.

A process for implementing step (e) is described in detail with reference to FIGS. 11A to 11E. FIG. 11A is a sectional view of the structure viewed in the direction of a cell string, which shows a section on which spacers are formed using a fourth insulating layer 25 on the surface of a resulting product obtained after even the control electrode 10 has been formed at step (d). As shown in FIG. 11B, a silicon substrate 1 is etched. Next, as shown in FIG. 11C, nitride layer spacers 26 are formed on the sidewalls of the fourth insulating layer 25. Next, as shown in FIG. 11D, an insulating layer, which will be the buried insulating layer 5, is formed, and the nitride layer spacers 26 are eliminated. When the nitride layer spacers are eliminated, part of the side surfaces of the etched semiconductor substrate is exposed. As shown in FIG. 11E, an epilayer is grown on the side surfaces of the exposed semiconductor substrate by using the exposed semiconductor substrate as a seed, so that a semiconductor thin film 11 is formed on the buried insulating layer 5.

After both the buried insulating layer 5 and the semiconductor thin film 11 have been formed through the above process, source/drain regions are formed in regions other than the regions of the cell devices, an interlayer insulating layer is formed on a resulting product, contacts are formed at a place requiring contacts in the device of regions other than the regions of the cell devices, and metal layers are sequentially formed. In this way, the cell string is manufactured.

Meanwhile, after the above-described buried insulating layer and the semiconductor thin film have been formed, the step of forming insulating layer spacers having a high dielectric constant on the sidewalls of the control electrode and facilitating the formation of an inversion layer using fringing electric fields may be further included. Alternatively, the step of forming insulating layer spacers on the sidewalls of the control electrode, injecting ions required for the formation of the source/drain regions of the cell device, and forming source/drain regions not overlapping the control electrode may be further included.

Although the preferred embodiments of the present invention have been disclosed for illustrative purposes, those skilled in the art will appreciate that various modifications and applications are possible, without departing from the scope and spirit of the invention as disclosed in the accompanying claims. Furthermore, it should be construed that differences pertinent to such modifications and applications fall within the scope of the present invention defined in the claims.

The flash memory cell string, the flash memory cell device, and the method of manufacturing them according to the present invention may be widely used in the NAND flash memory fields of semiconductor.

As described above, there is an advantage in that, under the specialty of NAND flash memory, a cell device having a flat channel structure in which each NAND flash memory cell constituting a single cell string does not have source/drain regions or in which the source/drain regions do not overlap control electrodes is constructed, so that, at a gate length of 40 nm or less, a short-channel effect may be further suppressed compared to an existing cell which has a flat channel structure having source/drain regions, thus improving size reduction characteristics. There is the following additional advantage, in addition to the above advantage.

First, even in a device for selecting a cell string together with a cell device, the same source or drain is formed not to overlap control electrodes (or gate electrodes), thus improving the degree of integration. That is, the degree of integration of the cell string itself is improved.

Second, since the present invention has a structure in which the source/drain of a cell device existing in a specific cell string do not exist, or do not overlap the control electrodes, Gate Induced Drain Leakage (GIDL) can be greatly low, so that current in an off-state can be further decreased. When the source/drain do not exist, junction leakage current between the source/drain and a substrate is not generated. Even though the source/drain are arranged not to overlap the control electrodes, the width thereof is small, thus reducing leakage current attributable to junction.

Third, since an existing flat channel structure is used, expenses required for the development of memory devices are reduced.

Fourth, an insulating layer is formed in the substrate, and assists the inversion layer of a channel attributable to fringing electric fields to be easily formed using interface charges between the insulating layer and the substrate, thus further increasing the magnitude of current in an ON state.

Hereinafter, one of the effects of the present invention will be described with reference to FIG. 12.

Figure 12:
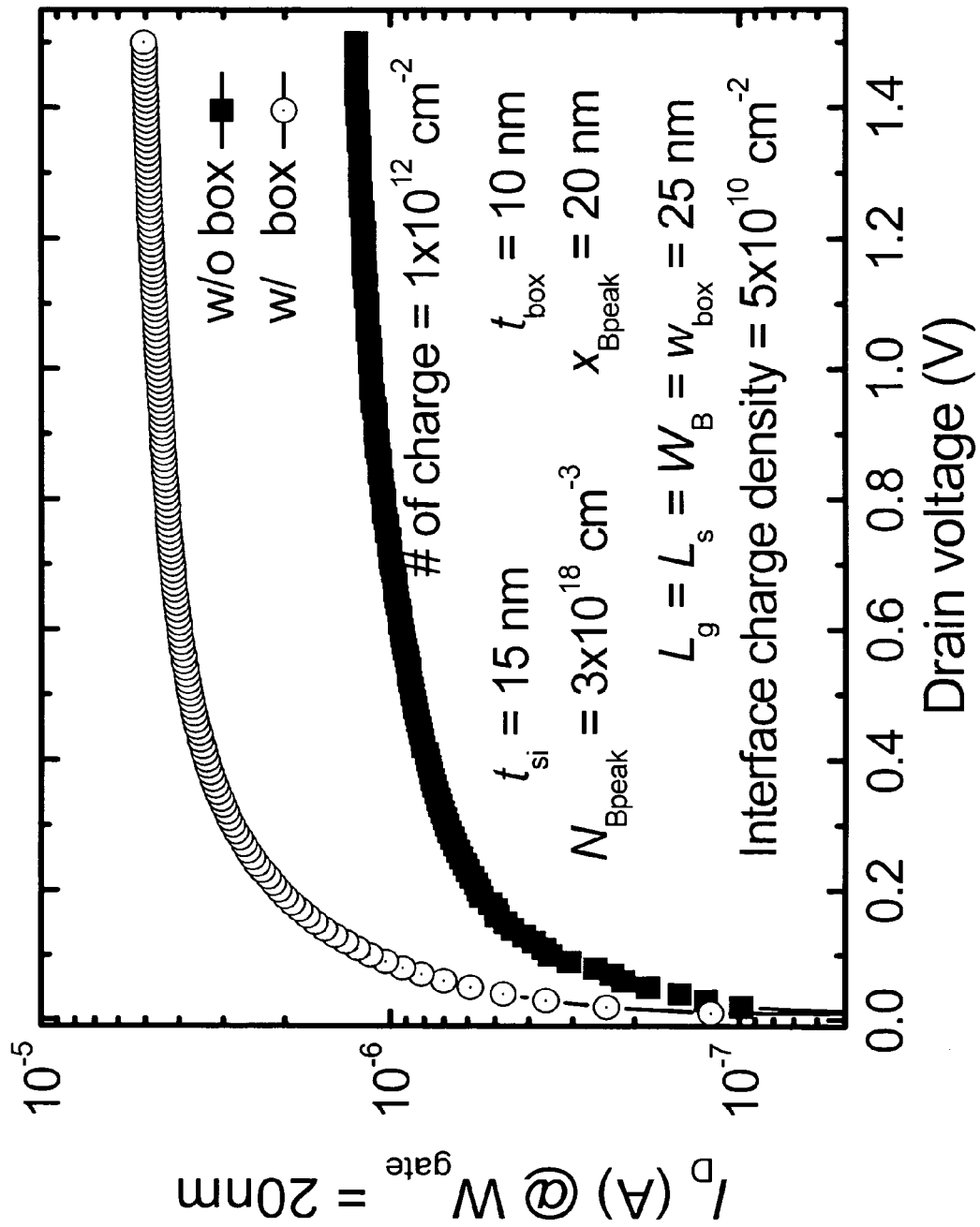

FIG. 12 is shown to describe one of the effects of the present invention. A Y axis denotes drain current required for a read operation in a cell device having a channel width of 20 nm. An X axis denotes voltage applied to the source or drain of the switching device. In the drawing, the thickness of the buried insulating layer is 10 nm and the width thereof is 25 nm. The length of the control electrode is 25 nm, and the distance between the relevant control electrode and an adjacent control electrode is 25 nm. It is assumed that the thickness of the silicon thin film is 15 nm, and interface charges of $5 \times 10^{10}$ cm$^{-2}$ are present at the edge of the buried insulating layer. In this drawing, all cells in the cell string are in an erased state. A voltage of 0V is applied to the control electrode of one cell in the cell string, and a pass voltage of 4.5V is applied to the control electrodes of the remaining cells. Consequently, current must sufficiently flow through this cell string. That is, it is preferable that current which is as large as possible flow through the cell string. In FIG. 12, when a buried insulating layer is formed between neighboring cells, the current is indicated by the open circles. When a buried insulating layer is not formed, the current is indicated by the solid rectangles. The current indicated by the open circles is the result of the present invention, and is about four times as high as the current, obtained when the buried insulating layer is not formed, at a voltage equal to or greater than a voltage of 0.3 V.

What is claimed is:

1. A flash memory cell string, comprising:
a plurality of sequentially connected cell devices; and
one or more switching devices arranged at ends of the connected cell devices and configured to select a specific cell string,
wherein each of the cell devices comprises:
a semiconductor substrate;
a first semiconductor thin film and a buried insulating layer formed on the semiconductor substrate;
a second semiconductor thin film formed on the first semiconductor thin film and the buried insulating layer;
a transmissive insulating layer, a charge storage node, and a control insulating layer sequentially formed on the second semiconductor thin film; and
a control electrode formed on the control insulating layer,
wherein the buried insulating layer is formed between the first semiconductor thin film and a further first semiconductor thin film of an adjacent cell device, and
wherein the first semiconductor film is formed below the control electrode.

2. The flash memory cell string according to claim 1, wherein each of the switching devices comprises:
a semiconductor substrate, a first semiconductor thin film, and a second semiconductor thin film identical to those of the cell device;
a gate stack formed on the second semiconductor thin film;
a control electrode formed on the gate stack; and
a source or drain region formed in a region of the second semiconductor thin film located on a side not connected to the cell device.

3. The flash memory cell string according to claim 2, wherein the gate stack is implemented as a single-layer insulating film, or is composed of a transmissive insulating layer, a charge storage node and a control insulating layer.

4. The flash memory cell string according to claim 2, wherein the switching device further comprises a buried insulating layer formed in a region of the first semiconductor thin film located on either or both of sides of the control electrode of the switching device.

5. The flash memory cell string according to claim 1, wherein the first semiconductor thin film has an etching ratio different from that of the semiconductor substrate, and the second semiconductor thin film has an etching ratio different from that of the first semiconductor thin film.

6. A flash memory cell string, comprising:
a plurality of sequentially connected cell devices; and
one or more switching devices arranged at ends of the connected cell devices and configured to select a specific cell string,
wherein each of the cell devices comprises:
a semiconductor substrate;
a first semiconductor thin film and a buried insulating layer formed on the semiconductor substrate;
a second semiconductor thin film formed on the first semiconductor thin film and the buried insulating layer;
a transmissive insulating layer, a charge storage node, and a control insulating layer sequentially formed on the second semiconductor thin film;
a control electrode formed on the control insulating layer; and
source and drain regions formed on the second semiconductor thin film disposed on both sides of the control electrode,
wherein the buried insulating layer is formed between the first semiconductor thin film and a further first semiconductor thin film of an adjacent cell device, and
wherein the first semiconductor film is formed below the control electrode.

7. The flash memory cell string according to claim 6, wherein the first semiconductor thin film has an etching ratio different from that of the semiconductor substrate, and the second semiconductor thin film has an etching ratio different from that of the first semiconductor thin film.

8. The flash memory cell string according to claim 6, wherein each of the switching devices comprises:
a semiconductor substrate, a first semiconductor thin film and a second semiconductor thin film identical to those of the cell device;
a gate stack formed on the second semiconductor thin film;
a control electrode formed on the gate stack; and
source and drain regions formed in regions of the second semiconductor thin film disposed on both sides of the control electrode.

9. The flash memory cell string according to claim 8, wherein the gate stack is implemented as a single-layer insulating layer, or is composed of a transmissive insulating layer, a charge storage node and a control insulating layer.

10. The flash memory cell string according to claim 6, wherein the source and drain regions of the switching device are doped at a higher density than that of source and drain regions of the cell device.

* * * * *